(12) United States Patent
Choi et al.

(10) Patent No.: US 7,474,556 B2
(45) Date of Patent: Jan. 6, 2009

(54) PHASE-CHANGE RANDOM ACCESS MEMORY DEVICE

(75) Inventors: Byung-gil Choi, Yongin-si (KR); Chang-soo Lee, Yongin-si (KR); Bo-tak Lim, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/655,160

(22) Filed: Jan. 19, 2007

(65) Prior Publication Data

US 2007/0206409 A1 Sep. 6, 2007

(30) Foreign Application Priority Data

Mar. 3, 2006 (KR) .............. 10-2006-0020654

(51) Int. Cl.
*G11C 11/00* (2006.01)

(52) U.S. Cl. .............. 365/163; 365/120; 365/121; 365/230.03; 365/230.06

(58) Field of Classification Search .......... 365/163, 365/120, 121, 230.06, 230.03
See application file for complete search history.

(56) References Cited

U.S. PATENT DOCUMENTS

2005/0270883 A1* 12/2005 Cho et al. .............. 365/230.03

FOREIGN PATENT DOCUMENTS

| KR | 100254565 B1 | 2/2000 |
| KR | 1020000027609 A | 5/2000 |
| KR | 1020050116569 A | 12/2005 |

\* cited by examiner

*Primary Examiner*—Amir Zarabian
*Assistant Examiner*—Fernando N Hidalgo
(74) *Attorney, Agent, or Firm*—Volentine & Whitt, PLLC

(57) ABSTRACT

A phase-change random access memory device is provided. The phase-change random access memory device includes a plurality of memory blocks, a main word line, a plurality of local word lines and a plurality of section word line drivers connected between the main word line and each of the plurality of local word lines and adapted to adjusting voltage levels of the plurality of local word lines in response of voltages applied to the main word line and block information. The plurality of section word line drivers include at least one first section word line driver and at least one second section word line driver. The first section word line drivers include pull-down devices while not including pull-up devices.

20 Claims, 7 Drawing Sheets

PHASE-CHANGE RANDOM ACCESS MEMORY DEVICE

BACKGROUND

1. Related Field

The disclosed methods and systems relates to a phase-change random access memory device, and more particularly to a phase-change random access memory device with a reduced layout area.

This application claims priority from Korean Patent Application No. 10-2006-0020654 filed on Mar. 3, 2006 in the Korean Intellectual Property Office, the disclosure of which is incorporated herein by reference in its entirety.

2. Description of the Related Art

Phase-change random access memories (PRAMs) store data using a phase-change material, such as any number of chalcogenide alloys, capable of taking either a crystalline state or an amorphous state based on specific applications of heating and cooling. The resistance of a crystalline phase-change material is relatively low compared to the resistance of the amorphous phase-change material. The crystalline state is referred to as a set (or "0") state, and the amorphous state is referred to as a reset (or "1") state.

FIG. 1 is a circuit diagram of a conventional phase-change random access memory (PRAM) device 1. As shown in FIG. 1, the conventional PRAM device 1 includes a plurality of memory blocks (BLKk; k=0~n), a plurality of main word lines (MWLp; p=0~m), a plurality of local word lines (LWLk; k=0~n) and a plurality of section word line drivers (SWDk; k=0~n).

The plurality of section word line drivers (SWDk; k=0~n) are arranged between each of the plurality of memory blocks (BLKk; k=0~n). The section word line drivers (SWDk; k=0~n) adjust the voltage levels of the plurality of local word lines (LWLk; k=0~n) in response to voltages applied to the respective main word lines (MWLp; p=0~m). As shown in FIG. 1, the plurality of section word line drivers (SWDk; k=0~n) are comprised of inverters having of PMOS transistors 10 pulling-up the voltage levels of the plurality of local word lines (LWLk; k=0~n) and NMOS transistors 20 pulling-down device the voltage levels of the plurality of local word lines (LWLk; k=0~n).

Since the conventional section word line drivers (SWDk; k=0~n) use inverters in such a manner, its layout area can be considerably large. That is, since it is desirable to use PMOS transistors 10 and NMOS transistors 20 arranged together, an isolation area (as required under relevant design rules) must be provided between each of the PMOS transistors 10 and NMOS transistors 20 to reduce the possibility of latch-up. In addition, since the PMOS transistors 10 occupy a much greater area than the NMOS transistors 20, it is necessary to reduce the number of PMOS transistors 10 used in product design to avoid an increase of the layout area.

SUMMARY

The disclosed methods and systems provide a phase-change random access memory device with a reduced layout area. The above and other objects of the disclosed methods and systems will be described in or be apparent from the following description of the disclosed embodiments.

According to an aspect of the disclosed methods and systems, there is provided a phase-change random access memory device including a plurality of memory blocks, each memory block including a plurality of phase-change memory cells, a main word line, a plurality of local word lines arranged corresponding to the plurality of memory blocks and a plurality of section word line drivers connected between the main word line and each of the plurality of local word lines and adjusting voltage levels of the plurality of local word lines in response of voltages applied to the main word line and block information, wherein the plurality of section word line drivers comprise at least one first section word line driver and at least one second section word line driver, wherein the at least one first section word line driver comprises pull-down devices pulling-down the voltage levels of the plurality of local word lines in response of voltages applied to the main word line and block information while not comprising pull-up devices, and wherein the at least one second section word line driver comprises pull-up devices pulling-up voltage levels of the plurality of local word lines in response of voltages applied to the main word line and pull-down devices pulling-down voltage levels of the plurality of local word lines in response of voltages applied to the main word line and block information.

According to another aspect of the disclosed methods and systems, there is provided a phase-change random access memory device including a main word line, a plurality of memory blocks with each of the plurality of memory blocks arranged corresponding each of a plurality of local word line coupled to the main word line, and a plurality of section word line drivers arranged between each of the plurality of memory blocks. The first and second section word line drivers are arranged at opposite sides of the at least one memory block, and at least one first section word line driver includes pull-down devices pulling-down the voltage levels of the plurality of local word lines in response of voltages applied to the main word line and block information while not including pull-up devices. At least one second section word line driver includes pull-up devices pulling-up voltage levels of the plurality of local word lines in response of voltages applied to the main word line and pull-down devices pulling-down voltage levels of the plurality of local word lines in response of voltages applied to the main word line and block information.

According to still another aspect of the disclosed methods and systems, there is provided a phase-change random access memory device including a plurality of memory blocks each including a plurality of phase-change memory cells, a main word line, a plurality of local word lines arranged corresponding to the plurality of memory blocks, and a plurality of section word line drivers connected between the main word line and each of the plurality of local word lines and adapted to adjust voltage levels of the plurality of local word lines in response of voltages applied to the main word line and block information.

BRIEF DESCRIPTION OF THE DRAWINGS

The above and other features and advantages of the disclosed methods and systems will become more apparent by describing in detail disclosed embodiments thereof with reference to the attached drawings in which.

DETAILED DESCRIPTION

Figure 1:
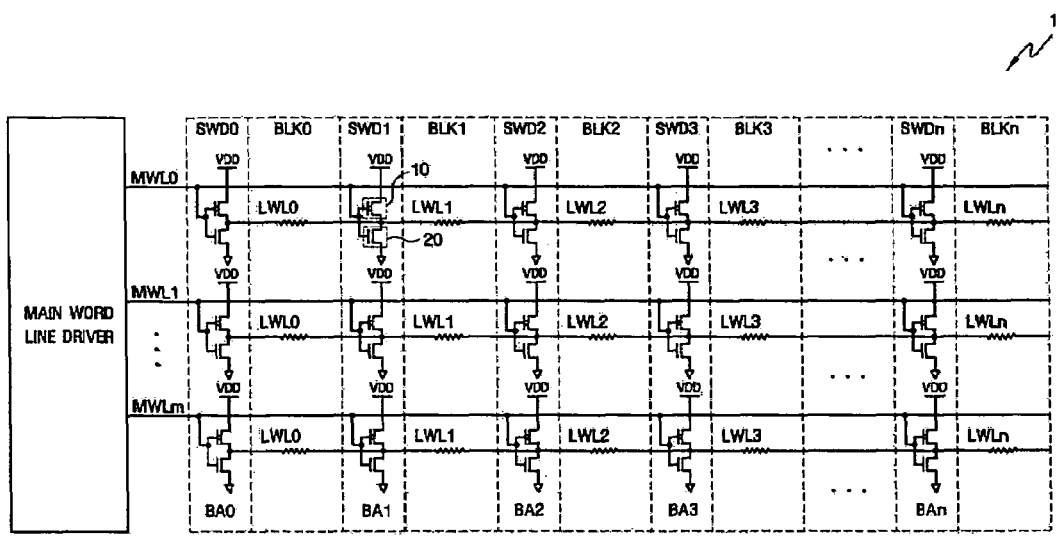
FIG. 1 is a circuit diagram of a conventional phase-change random access memory device.

Advantages and features of the disclosed methods and systems and methods of accomplishing the same may be understood more readily by reference to the following detailed description of disclosed embodiments and the accompanying drawings. The disclosed methods and systems may, however, be embodied in many different forms and should not be construed as being limited to the embodiments set forth herein. Rather, these embodiments are provided so that this disclosure will be thorough and complete and will fully convey the concept of the disclosed methods and systems to those skilled in the art, and the disclosed methods and systems will only be defined by the appended claims. Like reference numerals refer to like elements throughout the specification.

In the following description, the terms "and/or" comprises each and at least one combination of referenced items.

It is noted that the use of any and all examples, or exemplary terms provided herein is intended merely to better illuminate the disclosed methods and systems and is not a limitation on the scope of the disclosed methods and systems unless otherwise specified. The use of the terms "a" and "an" and "the" and similar referents in the context of describing the disclosed methods and systems (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Figure 2:
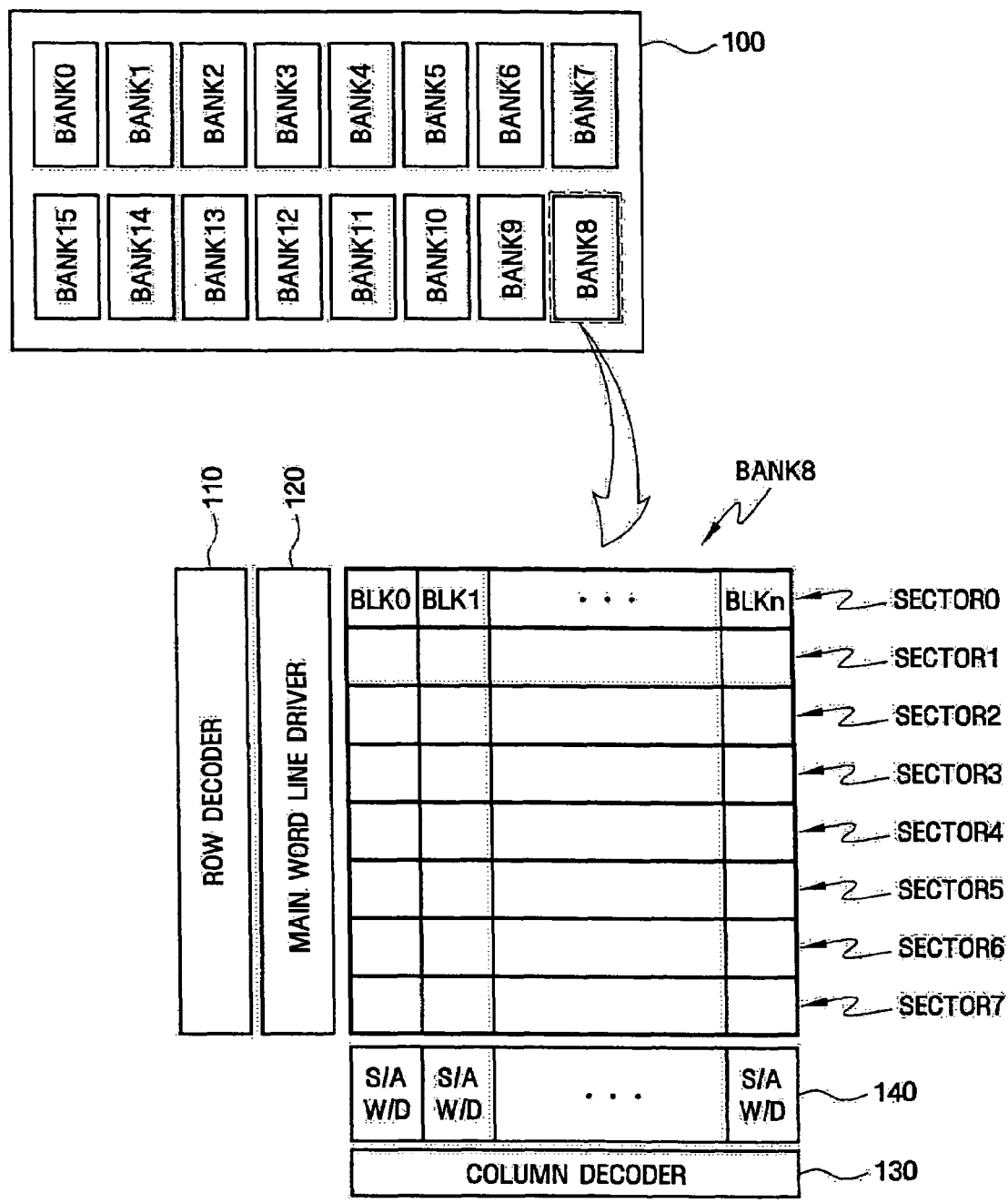
FIG. 2 is a block diagram of a phase-change random access memory device according to an embodiment of the disclosed methods and systems.

FIG. 2 is a block diagram of a phase-change random access memory (PRAM) device 100 according to an embodiment of the disclosed methods and systems. As shown in FIG. 2, the PRAM device 100 includes a plurality of memory banks (BANKi; i=0~15), a row decoder 110, a main word line driver 120, a column decoder 130, and an input/output (I/O) circuit 140.

Each of a plurality of memory banks (BANKi; i=0~15) includes a plurality of phase-change memory (PCM) cells arranged in a matrix array. Note that the plurality of memory banks (BANKi; i=0~15) may have a hierarchical structure. Each of the plurality of memory banks (BANKi; i=0~15) includes a plurality of memory sectors (SECTORj; j=0~7). Each of plurality of memory sectors (SECTORj; j=0~7) includes a plurality of memory blocks (BLKk; k=0~n).

In the following description, the disclosed methods and systems are explained with regard to a memory bank BANK8 among the plurality of memory banks (BANKi; i=0~15) by way of example, but it should be apparent that the disclosed methods and systems can also be applied to any of the other memory banks (BANKi; i=0~15).

The row decoder 110 designates a row address at the memory bank BANK8. The main word line driver 120 adjusts a voltage level of a main word line corresponding to the row address designated by the row decoder 110. The column decoder 130 designates a column address at the memory bank BANK8. The input/output (I/O) circuit 140 includes a sense amplifier and a write driver, and performs a write and/or read operations at the memory bank BANK8.

Figure 3:
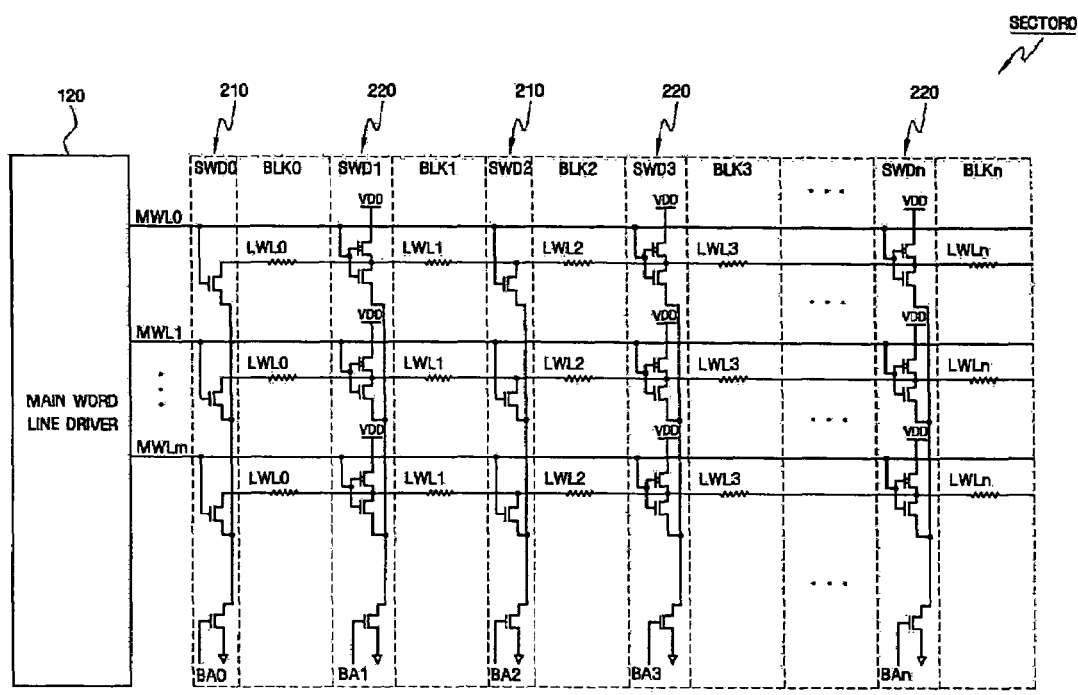
FIG. 3 is a circuit diagram of a phase-change random access memory device illustrating a first memory sector shown in FIG. 2.
Figure 4:
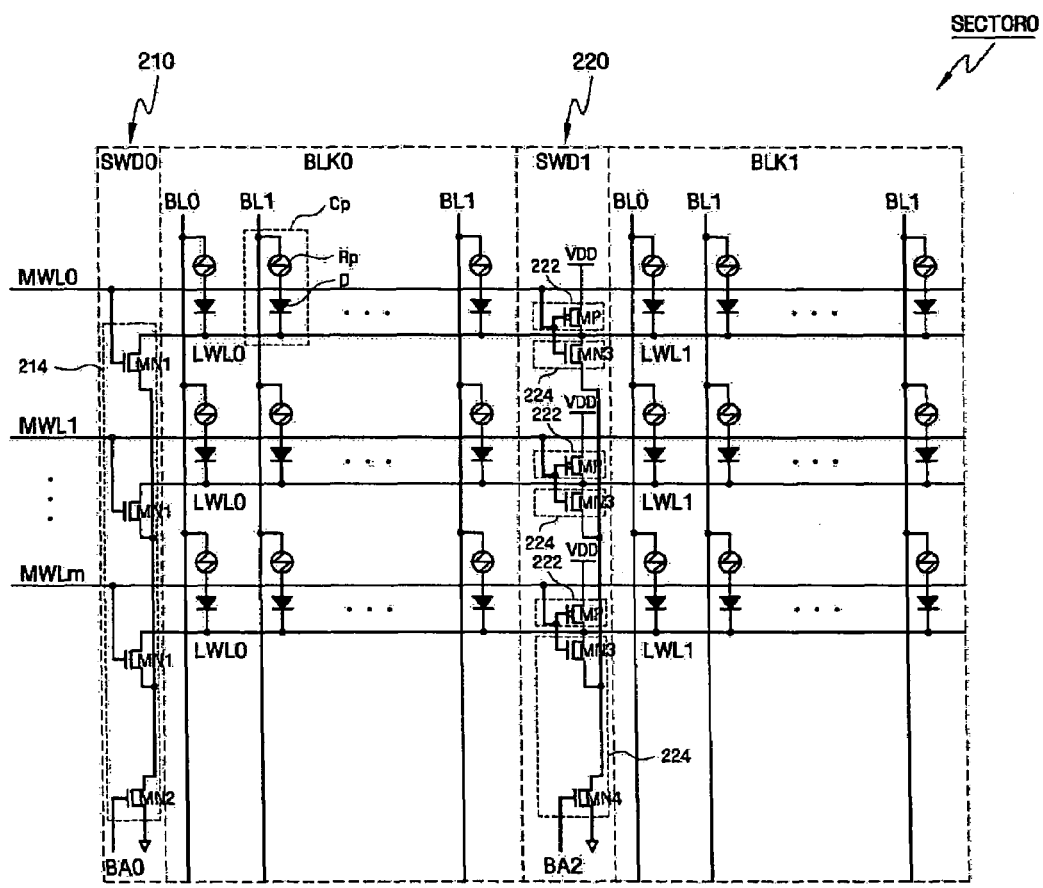
FIG. 4 is a detailed circuit diagram of section word line drivers and SWD1 and memory blocks.

FIG. 3 is a circuit diagram of a phase-change random access memory (PRAM) device illustrating a first memory sector SECTOR0 shown in FIG. 2, and FIG. 4 is a detailed circuit diagram of section word line drivers SWD0 and SWD1 and memory blocks BLK0 and BLK1.

As shown in FIGS. 3 and 4, the PRAM device includes a plurality of memory blocks BLKk (k=0~n), a plurality of main word lines (MWLp; p=0~m), a plurality of local word lines (LWLk; k=0~n) and a plurality of section word line drivers (SWDk; k=0~n). Each of the plurality of memory blocks (BLKk; k=0~n) includes a plurality of PCMs (Cp). The plurality of PCMs (Cp) are configured to interconnect the local word lines (LWLk; k=0~n)) and bit lines (BLq; q=0~l).

The word lines may be implemented by a hierarchical word line structure that includes a plurality of main word lines (MWLp; p=0~m) and plurality of local word lines (LWLk; k=0~n). In greater detail, the respective main word lines (MWLp; p=0~m) are arranged in common with the plurality of memory blocks (BLKk; k=0~n). The respective local word lines (LWLk; k=0~n) are arranged corresponding to the respective memory blocks (BLKk; k=0~n) and coupled to the main word lines (MWLp; p=0~m) through the section word line drivers (SWDk; k=0~n). Using this configuration, the plurality of PCMs (Cp) will be positioned at intersections of the local word lines (LWLk; k=0~n) and the bit lines (BLq; q=0~l).

Each of the plurality of PCMs (Cp) includes a variable resistor Rp containing a phase-change material having different resistance levels, i.e., a first resistance value and a second resistance value, depending on a current profile passing through it.

The variable resistor Rp is connected between one of the bit lines (BLq; q=0~l) and the access element D. The anode of the access element D is coupled to the variable resistor Rp, and the cathode of the access element D may be coupled to the local word lines (LWLk; k=0~n). Note that in a PCM (Cp) according to an alternative embodiment of the disclosed methods and systems, the variable resistor Rp and the access element D may be reversed in position.

In various embodiments, the phase-change material may be a binary (two-element) compound such as GaSb, InSb, InSe, $Sb_2Te_3$, or GeTe, a ternary (three-element) compound such as GeSbTe, GaSeTe, InSbTe, $SnSb_2Te_4$, or InSbGe, or a quaternary (four-element) compound such as AgInSbTe, (GeSn)SbTe, GeSb(SeTe), or $Te_{81}Ge_{15}Sb_2S_2$. Note that the most commonly used phase-change material is GeSbTe.

The various section word line drivers (SWDk; k=0~n) are connected between each of the plurality of main word lines (MWLp; p=0~m) and each of the plurality of local word lines (LWLk; k=0~n), and act to adjust voltage levels of the plurality of local word lines (LWLk; k=0~n) in response to voltages applied to the respective main word lines (MWLp; p=0~m) and block information (BAk; k=1~n).

The block information (BAk; k=1~n) may be a signal designating memory blocks (BLKk; k=0~n) corresponding to the plurality of local word lines (LWLk; k=0~n) connected to the plurality of section word line drivers (SWDk; k=0~n). Thus, as shown in FIG. 3, a section word line driver SWD1 may receive block information BA1 about a second memory block BLK1, and a section word line driver SWD2 may receive block information BA2 about a third memory block BLK2. In addition, although not shown in the figures, the second section word line driver SWD1 may receive block information BA0 about the first memory BLK0 and block information BA1 about the second memory BLK1. In such circumstances, the first and second memories BLK0 and BLK1 can be at opposite sides of the second section word line driver SWD1. The section word line driver SWD2 may receive block information BA1 about the second memory BLK1 and block information BA2 about the third memory BLK2.

In embodiments of the disclosed methods and systems, the plurality of local word lines (LWLk; k=0~n) comprise at least one first section word line driver 210 and at least one second section word line driver 220. In the exemplary embodiment shown in FIG. 3, the plurality of section word line drivers (SWDk; k=0~n) may include one or more first section word line drivers 210 and one or more second section word line drivers 220, which are alternately arranged.

Here, the first section word line driver(s) 210 include a pull-down device 214 that acts to pull down the voltage levels of the plurality of local word lines (LWLk; k=0~n) in response to voltages applied to the respective main word lines (MWLp; p=0~m) and block information (BAk; k=1~n). Note that there is no pull-up device.

The pull-down device 214 first section word line driver(s) 210 may include first and second NMOS transistors MN1 and MN2 connected in series between each of the plurality of local word lines (LWLk; k=0~n) and a ground voltage VSS. The first NMOS transistors MN1 are gated in response to the voltages applied to the respective main word lines (MWLp; p=0~m) and the second NMOS transistors MN2 are gated in response to the block information (BAk; k=1~n). The aforementioned configuration of the pull-down device 214 of the at least one first section word line driver 210 is an example only, and the disclosed methods and systems is not limited thereto.

In addition, the second section word line driver(s) 220 include a pull-up device 222 that acts to pull up the voltage level of their respective local word lines (LWLk; k=0~n) in response of a voltage applied to their respective main word lines (MWLp; p=0~m), and a pull-down device 224 that acts to pull down the voltage level of their respective local word lines (LWLk; k=0~n) in response of a voltage applied to their respective main word lines (MWLp; p=0~m) and the block information (BAk; k=1~n).

The pull-up device 222 the second section word line driver(s) 220 includes PMOS transistors MPs connected in series between a power supply voltage VDD and each of the plurality of local word lines (LWLk; k=0~n) as well as pull-down device 224 that include third and fourth NMOS transistors MN3 and MN4 connected in series between each of the plurality of local word lines (LWLk; k=0~n) and a ground voltage VSS. The PMOS transistors MPs and the third NMOS transistor MN3 are gated in response to the voltages applied to the respective main word lines (MWLp; p=0~m), and the third NMOS transistors MN4 is gated in response to the block information (BAk; k=1~n). The aforementioned configurations of the pull-up device 222 and the pull-down device 224 of the at least one first section word line driver 210 are examples only and the disclosed methods and systems are not limited thereto.

The first and second section word line drivers 210 and 220 operate in the following manner.

To perform a write or read operation of a PRAM device, it may be necessary to form current path so that write or read currents may pass through a selected PCM (Cp). In operation, the pull-up devices 222 and 224 of the second section word line driver(s) 210 and 220 are turned on in response to the voltages applied to the plurality of main word lines (MWLp; p=0~m) and the block information (BAk; k=1~n) to form the current paths used to perform a write or read operation.

During a write operation of a PRAM device, write current is provided to a variable resistor Rp containing a phase-change material (to heat the phase-change material above its melting temperature Tm and then rapidly cooled, so that it goes into the amorphous state, i.e., logic level "1." Otherwise, the variable resistor Rp may be heated to a temperature between a crystallization temperature Tx and the melting temperature Tm, maintained at the same temperature for a predetermined period of time and then cooled, so that it will go into the crystalline state, i.e., logic level "0." In order to induce a phase transition of the variable resistor Rp, a considerably large amount of write current may need to pass through the variable resistor Rp. For example, write current of about 1 mA and of about 0.6 to 0.7 mA may be applied for reset operation and set operation, respectively. The write current, which is provided from an input/output circuit (not shown), can pass through the bit lines (BLq; q=0~l), the variable resistor Rp, and the diodes D, and the local word lines (LWLk; k=0~n) to escape to the pull-down devices 214 and 224, respectively.

During a read operation of a PRAM device, read current(of a sufficiently low a level as not to induce a phase change to the variable resistor Rp) is provided in order to read data stored in the PRAM device. The read current, which is provided from an input/output circuit (not shown), passes through the bit lines (BLq; q=0~l), the variable resistor Rp, and the diodes D, and the local word lines (LWLk; k=0~n) to escape to the pull-down devices 214 and 224, respectively.

While the PRAM device is not actively operating, the pull-up device 222 of the second section word line driver 220 can be turned on such that the voltages of the local word lines (LWLk; k=0~n) can be maintained at a predetermined level.

The use of the first and second section word line drivers 210 and 220 provides for a number of advantages, including those described below.

Since the first section word line driver 210 uses only NMOS transistors as pull-down devices and do not use pull-up devices, the required layout area is reduced compared to the conventional configuration of FIG. 1. In the first section word line driver 210, since PMOS transistors are not used, it is not necessary to provide such an isolation area. In addition, since PMOS transistors MPs occupying a considerable layout area are not used, the overall layout area can be considerably further reduced.

Figure 5:
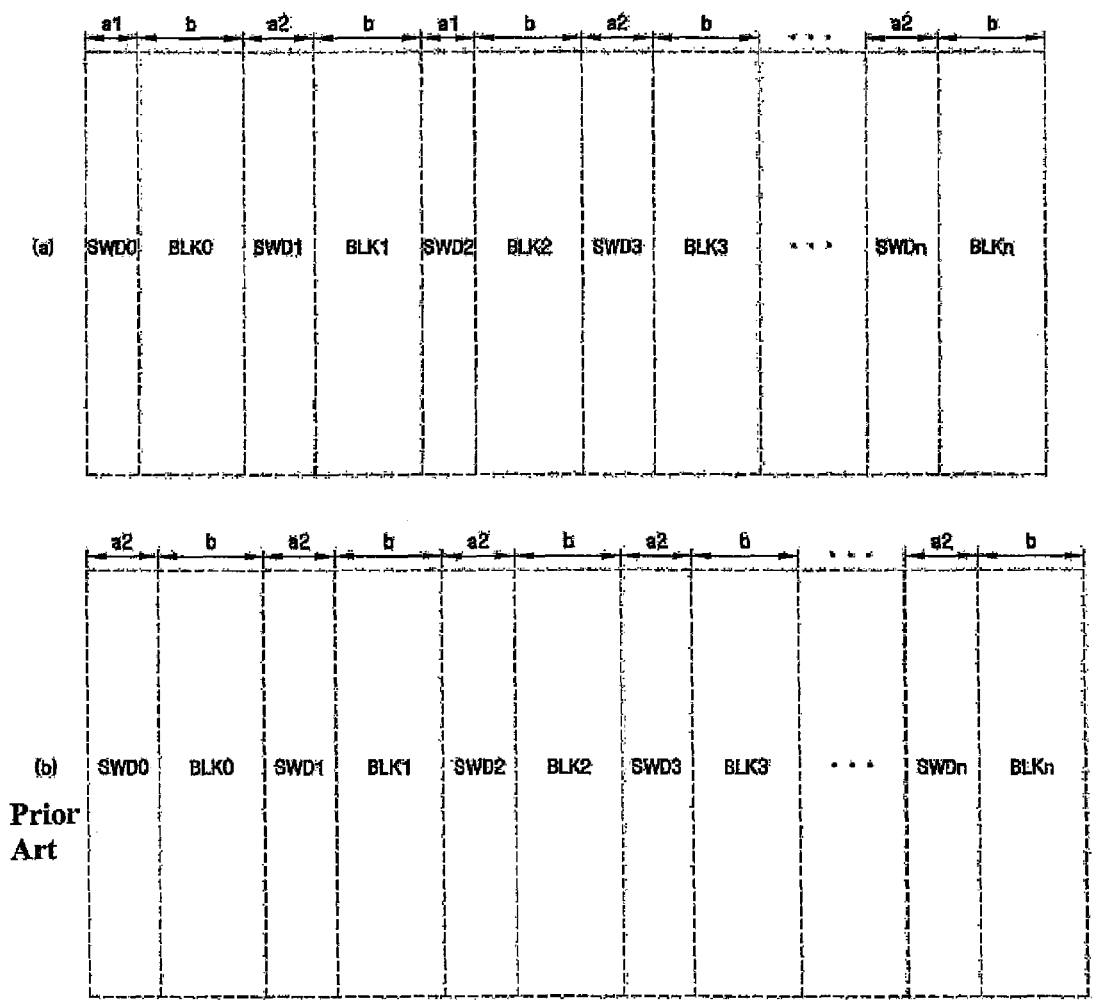
FIG. 5A is a diagram illustrating a layout area of the phase-change random access memory device according to an embodiment of the disclosed methods and systems.
FIG. 5B is a diagram illustrating a layout area of a conventional phase-change random access memory device.

FIG. 5A is a diagram illustrating a layout area of the PRAM device according to an embodiment of the disclosed methods and systems, and FIG. 5B is a diagram illustrating a layout area of a conventional PRAM device.

In FIGS. 5A and 5B, a1 denotes a width of a first section word line driver (210 of FIG. 3 or 4), a2 denotes a width of a second section word line driver (220 of FIG. 3 or 4), and b denotes a width of each of memory blocks (BLKk; k=0~n), respectively. A total width of the PRAM device shown in FIG. 5A, i.e., $\{(a1 \times n/2)+(a2 \times n/2)+(b \times n)\}$, is smaller than that of the conventional PRAM device shown in FIG. 5B, i.e., $\{(a2 \times n)+(b \times n)\}$.

Figure 6:
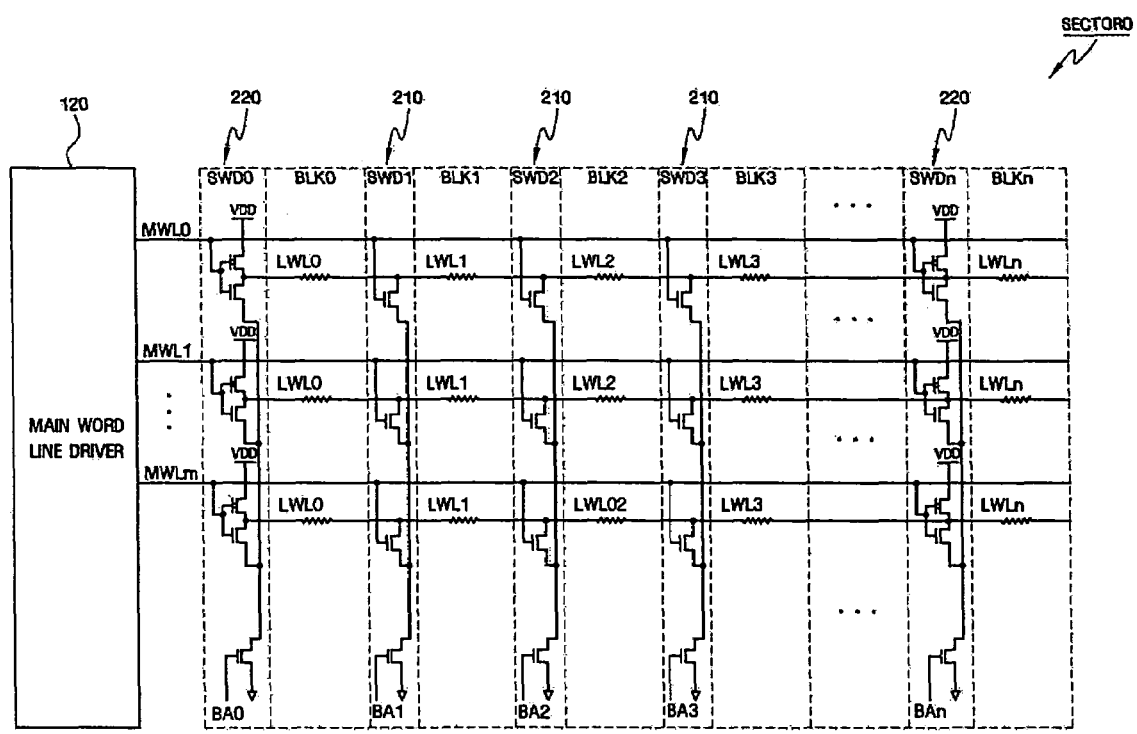
FIG. 6 is a circuit diagram of a phase-change random access memory device according to another embodiment of the disclosed methods and systems.
Figure 7:
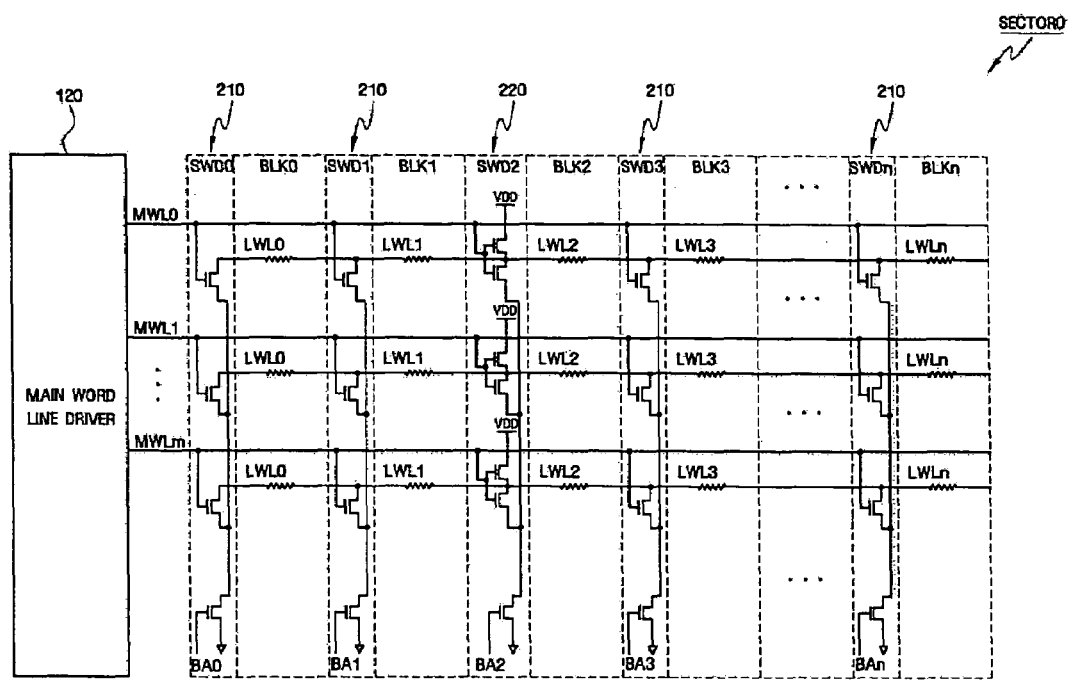
FIG. 7 is a circuit diagram of a phase-change random access memory device according to still another embodiment of the disclosed methods and systems.

FIG. 6 is a circuit diagram of a phase-change random access memory (PRAM) device according to another embodiment of the disclosed methods and systems, and FIG. 7 is a circuit diagram of a PRAM device according to still another embodiment of the disclosed methods and systems. Similar or the same reference numerals are given to those components that are similar or the same as the corresponding components shown in FIG. 3 and detailed explanations thereof are omitted.

Referring to FIG. 6, the PRAM device according to another embodiment of the disclosed methods and systems can include a couple of spaced-apart second section word line drivers 220 arranged at opposite sections, and first section word line drivers 210 can be arranged at the remaining sections.

Referring to FIG. 7, the PRAM device according to still another embodiment of the disclosed methods and systems can include a second section word line driver 220 arranged at a central section, and first section word line drivers 210 can be arranged at the remaining sections. Using this configuration, the number of the first section word line drivers 210 used is more than that in the previous embodiment, thereby reducing the overall layout area of the PRAM device.

While in the above-description, arrangements of the first and second section word line drivers have been described with reference to FIGS. 3, 6 and 7, it will be apparent to those skilled in the art that the first and second section word line drivers may be arranged in a wide variety of ways of arrangement.

As described above, the PRAM device according to the disclosed methods and systems can reduce a layout area using only section word line drivers including pull-down devices pulling-down voltage levels of local word lines in response to voltages applied to main word lines and block information without the use of pull-up devices.

Example embodiments of the disclosed methods and systems have been disclosed herein and they are used and are to be interpreted in a generic and descriptive sense only and not for purpose of limitation. Accordingly, it will be understood by those of ordinary skill in the art that various changes in form and details may be made without departing from the spirit and scope of example embodiments of the disclosed methods and systems as set forth in the following claims.

What is claimed is:

1. A phase-change random access memory device, comprising:
    a plurality of memory blocks, each memory block including a plurality of phase-change memory cells;
    a main word line arranged in common with the plurality of memory blocks;
    a plurality of local word lines arranged corresponding to the plurality of memory blocks, respectively; and
    a plurality of section word line drivers, each section word line driver being connected between the main word line and at least one respective local word line of a corresponding memory block and adapted to adjust a voltage level of the at least one respective local word line in response to a voltage applied to the main word line and block information of the corresponding memory block,
    wherein the plurality of section word line drivers include at least one first section word line driver and at least one second section word line driver,
    wherein the at least one first section word line driver includes at least one pull-down device pulling-down the voltage level of at least one respective local word line in response to voltages applied to the main word line and first block information, while not including a pull-up device, and
    wherein the at least one second section word line driver includes at least one pull-up device pulling-up the voltage level of at least one respective local word line in response to the voltages applied to the main word line and at least one pull-down device pulling-down the voltage level of at least one respective local word line in response to the voltages applied to the main word line and second block information, the second block information being different from the first block information.

2. The phase-change random access memory device of claim 1, wherein the first block information designates a first memory block corresponding to a local word line connected with each of the plurality of section word line drivers.

3. The phase-change random access memory device of claim 1, wherein each of the pull-down devices includes first and second NMOS transistors connected in series between each of the plurality of local word lines and a ground voltage, wherein the first NMOS transistor is gated in response to the voltages applied to the main word line and the second NMOS transistor is gated in response to the first block information.

4. The phase-change random access memory device of claim 1, wherein each of the pull-up devices includes PMOS transistors connected between a power supply voltage and a respective local word lines;
    wherein each of the pull-down devices includes first and second NMOS transistors connected in series between each of the plurality of local word lines and a ground voltage; and
    wherein the PMOS transistors and the first NMOS transistors are gated in response to the voltages applied to the main word line, and the second NMOS transistor is gated in response to one of the first and second block information.

5. The phase-change random access memory device of claim 1, wherein the plurality of section word line drivers comprise first and second section word line drivers that are alternately arranged from one another.

6. The phase-change random access memory device of claim 1, wherein the plurality of section word line drivers comprises at least two first section word line drivers positioned between a couple of spaced apart second section word line drivers.

7. The phase-change random access memory device of claim 1, wherein the plurality of section word line drivers comprise a second section word line driver arranged at a central section, and a plurality of first section word line drivers positioned on both sides of the central second section word line driver.

8. The phase-change random access memory device of claim 1, wherein each phase-change memory cell comprises a variable resistor containing a phase change material having at least two resistance values based on a current profile passing through the phase-change memory cell, and an access element controlling the current profile.

9. The phase-change random access memory device of claim 8, wherein the access element includes a diode connected in series with the variable resistor.

10. The phase-change random access memory device of claim 8, wherein the phase-change material is made of germanium (Ge), antimony (Sb) and tellurium (Te).

11. A phase-change random access memory device comprising:
    a main word line;
    a plurality of local word lines coupled to the main word line;
    a plurality of memory blocks arranged in common with the main word line and a respective local word line of the plurality of local word lines; and
    a plurality of section word line drivers arranged between each of the plurality of memory blocks,
    wherein first and second section word line drivers of the plurality of word line drivers are arranged at opposite sides of a first memory block, wherein the first section word line driver includes pull-down devices pulling-down a voltage level of the respective local word line of the first memory block in response to a voltage applied to the main word line and first block information, while not including a pull-up device, and wherein the second section word line driver includes pull-up devices pulling-up a voltage level of the respective local word lines of the first memory block and a second memory block in response to the voltage applied to the main word line and pull-down devices pulling-down the voltage level of the respective local word line of the second memory block in response to the voltage applied to the main word line and second block information, the second block information being not the same as the first block information.

12. The phase-change random access memory device of claim 11, wherein the first block information designates the first memory block and the second block information designates the second memory block.

13. The phase-change random access memory device of claim 11, wherein each of the pull-down devices of the first section word line driver comprises first and second NMOS transistors connected in series between the respective local word line and a ground voltage, the first NMOS transistor being gated in response to the voltage applied to the main word line, and the second NMOS transistor being gated in response to the first block information.

14. The phase-change random access memory device of claim 11, wherein each of the pull-up devices of the second section word line driver comprises a PMOS transistor connected between a power supply voltage and the respective local word line, and each of the pull-down devices comprises first and second NMOS transistors connected in series between the respective local word line and a ground voltage, the PMOS transistor and the first NMOS transistor being gated in response to the voltage applied to the main word line, and the second NMOS transistor being gated in response to the second block information.

15. A phase-change random access memory device comprising:

a plurality of memory blocks, each memory block including a plurality of phase-change memory cells and a plurality of local word lines;

a plurality of main word lines; and a plurality of section word line drivers, each section word line driver being connected between the plurality of main word lines and the plurality of local word lines of a corresponding memory block to adjust voltage levels of the plurality of local word lines of the corresponding memory block in response to voltages applied to the plurality of main word lines, wherein the plurality of section word line drivers comprises a first section word line driver and a second section word line driver, wherein the first section word line driver comprises a plurality of pull-down devices for pulling-down voltage levels of the plurality of local word lines of a corresponding first memory block in response to the voltages applied to the plurality of main word lines and first block information, while not including a pull-up device, and wherein the second section word line driver comprises a plurality of pull-up devices for pulling-up voltage levels of the plurality of local word lines of a corresponding second memory block in response to the voltages applied to the plurality of main word lines, and a plurality of pull-down devices for pulling-down the voltage levels of the plurality of local word lines of the corresponding second memory block in response to the voltages applied to the plurality of main word lines and second block information, and wherein each of the pull-down devices comprises first and second NMOS transistors connected in series between a respective local word line and a ground voltage, the first NMOS transistor being gated in response to the voltage applied to a corresponding main word line and the second NMOS transistor being gated in response to one of the first and second block information.

16. The phase-change random access memory device of claim 15, wherein each of the pull-up devices comprises a PMOS transistor connected between a power supply voltage and a respective local word line, the PMOS transistor being gated in response to the voltage applied to a corresponding main word line.

17. The phase-change random access memory device of claim 15, wherein the plurality of section word line drivers comprise a plurality of first and second section word line drivers alternately arranged from one another.

18. The phase-change random access memory device of claim 15, wherein the plurality of section word line drivers comprise at least two first section word line drivers positioned between two second section word line drivers.

19. The phase-change random access memory device of claim 15, wherein the plurality of section word line drivers comprise a plurality of first section word line drivers, the second section word line driver being at a central section, and the plurality of first section word line drivers being positioned on both sides of the central second section word line driver.

20. The phase-change random access memory device of claim 15, wherein each of the first and second block information designates a memory block corresponding to a local word line connected with each of the plurality of section word line drivers.

* * * * *